United States Patent
Lamy

(10) Patent No.: US 9,536,837 B2
(45) Date of Patent: Jan. 3, 2017

(54) TSV VIA PROVIDED WITH A STRESS RELEASE STRUCTURE AND ITS FABRICATION METHOD

(71) Applicant: COMMISSARIAT A L'ENERGIE ATOMIQUE ET AUX ENE ALT, Grenoble (FR)

(72) Inventor: Yann Lamy, Grenoble (FR)

(73) Assignee: Commissariat a l'energie atomique et aux energies alternatives, Paris (FR)

(*) Notice: Subject to any disclaimer, the term of this patent is extended or adjusted under 35 U.S.C. 154(b) by 0 days.

(21) Appl. No.: 13/725,020

(22) Filed: Dec. 21, 2012

(65) Prior Publication Data

US 2013/0161828 A1    Jun. 27, 2013

(30) Foreign Application Priority Data

Dec. 23, 2011   (FR) ...................................... 11 62372

(51) Int. Cl.
| | |
|---|---|
| H01L 29/40 | (2006.01) |
| H01L 23/52 | (2006.01) |
| H01L 23/48 | (2006.01) |
| H01L 23/538 | (2006.01) |
| H01L 21/48 | (2006.01) |

(52) U.S. Cl.
CPC ......... *H01L 23/5384* (2013.01); *H01L 21/486* (2013.01); *H01L 23/481* (2013.01); *H01L 2224/02372* (2013.01); *H01L 2224/0401* (2013.01); *H01L 2224/05* (2013.01); *H01L 2224/05569* (2013.01); *H01L 2224/06181* (2013.01); *H01L 2224/13022* (2013.01); *H01L 2924/00014* (2013.01)

(58) Field of Classification Search
CPC ... H01L 21/486; H01L 23/5384; H01L 23/481
USPC ............................ 257/774; 438/15, 109, 652
See application file for complete search history.

(56) References Cited

U.S. PATENT DOCUMENTS

| | | | |
|---|---|---|---|
| 4,964,212 A | 10/1990 | Deroux-Dauphin et al. | |
| 5,343,071 A | 8/1994 | Kazior et al. | |
| 5,910,687 A * | 6/1999 | Chen et al. ................... | 257/784 |
| 7,253,527 B2 * | 8/2007 | Tanida ............. | H01L 21/76898 257/774 |

(Continued)

FOREIGN PATENT DOCUMENTS

| | | |
|---|---|---|
| EP | 0 363 256 B1 | 4/1992 |
| FR | 2 923 080 A1 | 5/2009 |

OTHER PUBLICATIONS

Preliminary Search Report issued Aug. 1, 2012 in French Patent Application No. 1162372 with English translation of categories of cited documents.

(Continued)

*Primary Examiner* — John C Ingham
*Assistant Examiner* — Ismail Muse
(74) *Attorney, Agent, or Firm* — Oblon, McClelland, Maier & Neustadt, L.L.P.

(57) ABSTRACT

A TSV via structure comprising an upper part made on the side of the front face of a substrate in which electronic components are located and a lower part with height and cross-section smaller than the height and cross-section the upper part, the arrangement of the connection element in the substrate being such that it releases stresses generated by the different materials of said structure.

13 Claims, 12 Drawing Sheets

(56) References Cited

U.S. PATENT DOCUMENTS

| | | |
|---|---|---|
| 2008/0076195 A1 | 3/2008 | Shiv |
| 2008/0081398 A1* | 4/2008 | Lee et al. ................... 438/109 |
| 2008/0218983 A1* | 9/2008 | Nakamura ............ C23C 26/00 |
| | | 361/748 |
| 2009/0045475 A1* | 2/2009 | Wan .................... G01R 15/207 |
| | | 257/427 |
| 2009/0191704 A1* | 7/2009 | Shiv ............................. 438/652 |
| 2010/0015734 A1 | 1/2010 | Shiv |
| 2010/0140752 A1* | 6/2010 | Marimuthu ......... H01L 23/3121 |
| | | 257/621 |
| 2010/0148210 A1* | 6/2010 | Huang et al. .................... 257/99 |
| 2010/0264548 A1* | 10/2010 | Sanders et al. .............. 257/774 |
| 2010/0289092 A1* | 11/2010 | Perng et al. .................. 257/401 |
| 2010/0321544 A1* | 12/2010 | Matsuo et al. ............... 348/294 |
| 2011/0042807 A1* | 2/2011 | Liu et al. ...................... 257/737 |
| 2011/0115097 A1* | 5/2011 | Shau ............................ 257/774 |
| 2011/0291153 A1* | 12/2011 | Yang .................... H01L 33/486 |
| | | 257/99 |
| 2012/0228778 A1* | 9/2012 | Kosenko ........... H01L 21/76898 |
| | | 257/774 |

OTHER PUBLICATIONS

D. Henry, et al., "Development and Characterisation of High Electrical Performances TSV for 3D Applications", EPTC Conference 2009, pp. 1-8.

D. Y. Chen et al., "Enabling 3D-IC Foundry Technologies for 28 nm Node and Beyond: Through-Silicon-Via Integration with High Throughput Die-to-Wafer Stacking", 2009 IEEE, Electron Devices Meeting, IEDM, 2009, pp. 09-353/09-356.

U.S. Appl. No. 14/510,525, filed Oct. 9, 2014, Lamy, et al.

\* cited by examiner

TSV VIA PROVIDED WITH A STRESS RELEASE STRUCTURE AND ITS FABRICATION METHOD

TECHNICAL FIELD

The invention relates to the field of microelectronic and/or nano-electronic and microsystems and/or nanosystems and particularly the field of vertical interconnection structures commonly called TSV (Through Silicon Vias) passing through a semiconducting substrate.

It allows for the use of a microelectronic and/or nano-electronic device provided with a vertical TSV interconnection structure with an improved shape and arrangement so as to limit stresses induced by materials forming this structure on the remainder of the device.

PRIOR ART

TSV type vias can be used during the manufacture of electronic devices comprising a plurality of stacked substrates or chips to pass through the thickness of one or several of these substrates or these chips.

TSV vias can be used to make a connection between a conducting element located on a face called "front face" or the side of the front face of a substrate and another conducting element located on another face called the "back face" or the side of the back face of said substrate.

Several families of methods for making a TSV vias exist depending on whether the vias are made before or after or at the same time as the electronic components to be interconnected.

In a method of the type commonly called "via first", the TSV vias are made before the electronic components on the substrate, particularly before the transistors.

In a method of the type commonly called "via middle", the TSV vias are made after components are made but before the electric connections of these components.

In a method of the type commonly called the "via last", the TSV vias are made after the fabrication of electronic components and their connections to an external device.

TSV vias are formed by filling at least one hole passing through a semiconducting support using a conducting material. The coefficient of thermal expansion of the metallic material that fills the hole is usually very different from that of the semiconducting support.

When the filling material is made of Cu, the coefficient of thermal expansion may for example be of the order of 18 ppm/° C. whereas the coefficient of thermal expansion of an Si based support may for example be of the order of 2.6 ppm/° C.

Furthermore, in the case in which the vias are filled subsequently by means of a passivation polymer to insulate the metallic material from the support material, this expansion effect is also amplified because the filling polymers have even higher coefficients of expansion, for example between 60 and 180 ppm/° C.

A large difference in coefficients of thermal expansion can cause high mechanical stresses within a microelectronic device, these stresses possibly causing particularly separation or delamination of the metallic material or a failure of contact continuity zones formed on the front face and the back face of a substrate. The typical order of magnitude of stresses that must not be exceeded is usually of the order of 100 MPa, for a stress of more than 500 MPa that can cause rupture.

The document entitled "*Development and characterisation of high electrical performances TSV for 3D applications*", D. Henry et al. EPTC Conference 2009 discloses a method for making a TSV via structure formed from a metallic connection element lining the walls of a hole passing through the substrate.

In this method, the via hole is made through the back face of the substrate so as to open up directly on a metallic zone to be connected without making any contact continuity on the front face of the substrate.

Document EP 0363256 B1 discloses a TSV via structure formed by laser etching from the back face of a substrate.

This structure is formed from a metallic connection element lining the walls of a hole passing through the substrate. During the substrate etching step, its front face is protected by means of a layer providing protection against splashes caused by etching. This protection layer may possibly be conducting and it can also be used to maintain continuity of the contact on the front face.

The document entitled "*Enabling 3d-IC foundry technologies for 28 nm node and beyond: TSV integration with high throughput die-to-wafer stacking*" D. Y. chen et al. TSMC, IEDM09-353 discloses a method for making a TSV via by etching the front face of a substrate.

Document US 2010/0264548 discloses a method for making a TSV via in two parts in which an upper part of a connection element is formed by making small holes through the front face of a substrate which are subsequently filled by means of a metallic material, and another larger hole is then made through the back face and a metallic material is deposited lining the walls of this other hole.

The method disclosed in this document requires that several steps are done to achieve contact continuity on the front face.

The problem arises of finding a new TSV via structure with less strict stress phenomena, and a new method of making such a structure.

PRESENTATION OF THE INVENTION

This invention applies firstly to a method of making an interconnection structure comprising steps to:

form a first hole through a first face of a support on which one or several electronic components are or will be made, the first hole partially passing through the support and having a critical dimension $D_1$ and a height $H_1$, make an upper part of a conducting connection element by the formation of a conducting material in said first hole so as to cover the walls and the bottom of said first hole, a central zone in the first hole not being filled by said metallic material, form at least one second hole through a second face of the support opposite said first face, said second hole being made along a prolongation of the first hole and opening up on said upper part of said connection element, said second hole also being formed so as to have a critical dimension $D_2 < D_1$ and a height $H_2 < H_1$, make a lower part of said conducting connection element by the formation of a conducting material in said second hole so as to cover the walls and the bottom of the second hole, a central zone of said second hole not being filled by said conducting material.

Such a method can be used to make a via in which the stresses are limited.

After making the upper part and before formation of said second hole(s), the method may also comprise the formation of a layer of a given material on said second face of the support, designed such that said given material has a Young's modulus and a coefficient of thermal expansion higher than the Young's modulus and the coefficient of thermal expansion of the support, respectively.

Such a layer can limit stresses.

According to one possible embodiment of the method, the critical dimension $D_1$, the critical dimension D2 and the height $H_2$, may be selected such that (D1−D2)/H2>4.

According to one possible embodiment of the method, an insulating material can be formed before said upper part of the said connection element is formed so as to line the bottom and the walls of said first hole. Formation of said second hole may then comprise etching of the support as far as said insulating material, the method also comprising the following, before formation of said lower part of said connection element:

formation of an insulating material so as to line the walls and bottom of said second hole, etching of the bottom of the second hole of said insulating materials, so as to prolong said second hole and expose said upper part of said connection element.

After the formation of said upper part of said conducting connection element and before formation of said second hole(s), there may be a step to thin the support on the side of said second face of the support.

According to one possible embodiment of the method, the second hole may have a height $H_2$ such that $H_2<H_1/10$.

According to one possible embodiment of the method, the diameter $D_2$ of the second hole may be such that $D_2 \leq 0.5*D_1$.

Such aspect ratios can limit stresses within the via.

According to one possible embodiment of the method, said central zone of said first hole may be filled with an insulating material after said upper part of said conducting connection element has been made.

Said insulating filling material of said central zone of the first hole may be selected to have a lower coefficient of thermal expansion than said conducting material lining the walls and the bottom of the first hole, so as to reduce stresses in the via.

According to one possible embodiment of the method, after said lower part of said conducting connection element has been made, said central zone of said second hole may be filled with an insulating material.

In order to reduce stresses within the via, said insulating filling material of said central zone of the second hole may have a lower coefficient of thermal expansion than said conducting material covering the walls and bottom of the second hole.

According to one possible embodiment of the method, production of said upper part of said conducting connection element may comprise the formation of a conducting zone extending on or parallel to the first face of the support.

After said lower part of said conducting connection element has been made, the method may include the formation of a zone of said conducting material extending on or parallel to the second face of the support.

This invention also relates to an interconnection structure comprising a conducting connection element provided with:

an upper part opening up on a first face of a support on which one or several electronic components are made or will be made, the upper part being made in a first hole partially passing through said support and having a critical dimension $D_1$ and a height $H_1$, said upper part being formed from a conducting material covering the walls and the bottom of a first hole, a central zone in the first hole not being filled with said conducting material, a lower part connected to said upper part and opening up on a second face of the support opposite the first face, the lower part being made in one or several second hole(s) communicating with the first hole and partially passing through said support, the second hole(s) having a critical dimension $D_2<D_1$ and height $H_2<H_1$, said lower part being formed from a conducting material covering the walls and the bottom of the second hole(s), a central zone of said second hole(s) not being filled by said conducting material.

According to one possible embodiment of the structure, a layer based on a given material with a Young's modulus and a higher coefficient of thermal expansion than the Young's modulus and coefficient of thermal expansion of the support, may be provided on the second face of the support.

For example, the given material may be AlN or TiW.

According to one possible embodiment of the structure, the central zone of said first hole and/or second hole may be filled with an insulating material.

According to one possible embodiment of the structure, the coefficient of thermal expansion of the insulating material filling the central zone of said first hole and/or second hole may be lower than that of said conducting material.

According to one possible embodiment of the structure, the critical dimension $D_1$, the critical dimension D2 and the height $H_2$ may be selected such that (D1−D2)/H2>4.

According to one possible embodiment of the structure, the height $H_2$ of said second hole(s) may be such that $H_2<H_1/10$.

According to one possible embodiment of the structure, the diameter $D_2$ of said second hole(s) may be such that $D_2 \leq 0.5*D_1$.

According to one possible embodiment of the structure in which said upper part of said metallic connection element comprises a conducting zone extending on or parallel to the first face of the support, said lower part of said conducting connection element may comprise a conducting zone extending on or parallel to the second face of the substrate.

BRIEF DESCRIPTION OF THE DRAWINGS

This invention will be better understood after reading the description of example embodiments given purely for information and in no way limitative, with reference to the appended drawings in which.

Identical, similar or equivalent parts of the different figures are marked with the same numeric references in order to facilitate comparison between different figures.

The different parts shown in the figures are not necessarily all shown at the same scale, to make the figures more easily understandable.

DETAILED PRESENTATION OF PARTICULAR EMBODIMENTS

Figure 1:
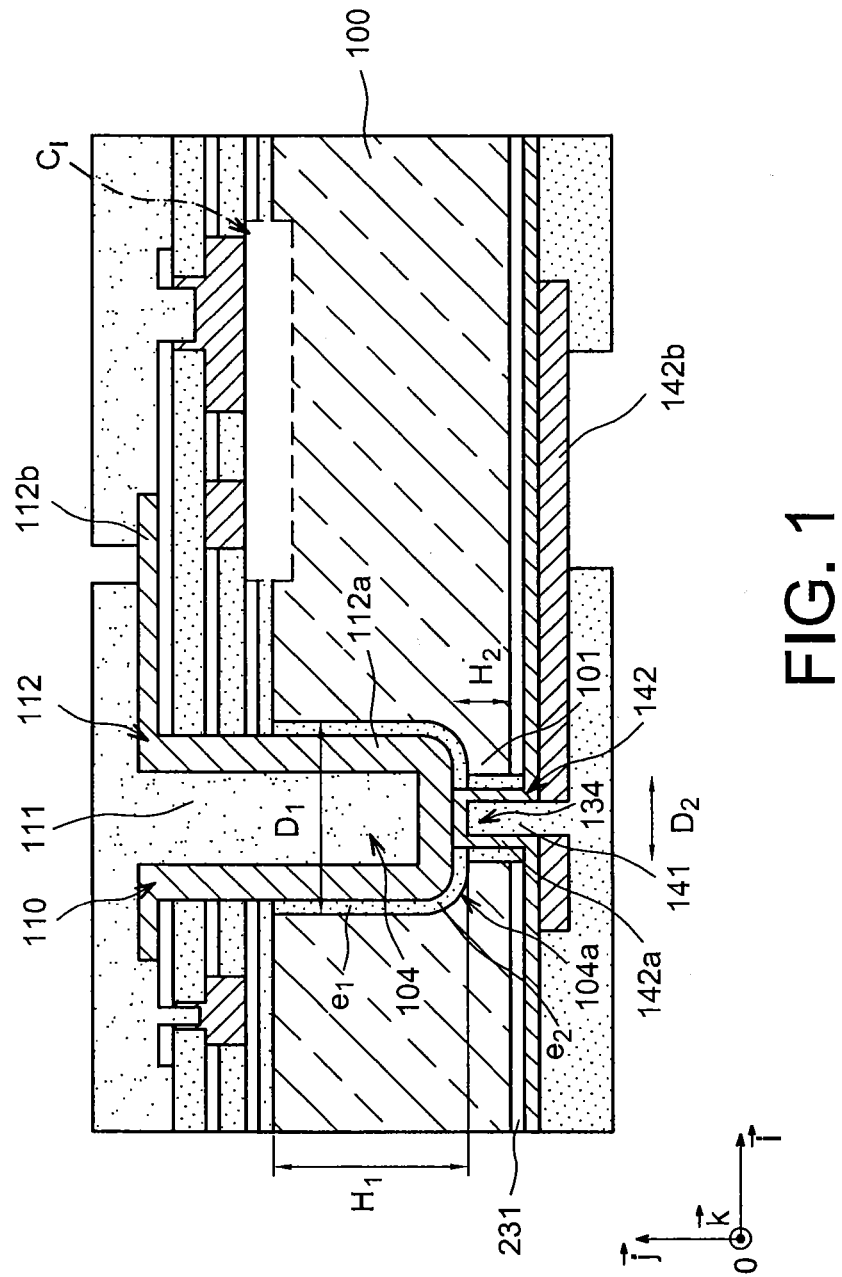
FIG. 1 shows an example interconnection structure according to the invention, this structure comprising a connection element passing through a support and being configured so as to limit mechanical stress phenomena induced by the component materials.

An example interconnection structure according to the invention will now be presented with reference to FIG. 1.

This is a TSV (Through Silicon Via) type structure that passes through a substrate 100 that may be semiconducting and for example based on Si and have a thickness for example between 100 μm and 300 μm, or for example between 10 μm and 100 μm.

This structure is formed from a metallic connection element 110 that may for example be based of copper and may comprise an upper part 112 made in a first hole 104 passing partially through the substrate 100 and opening up on the side of a face of the substrate called the "front face".

The front face of the substrate 100 is a face on which one or several electronic components $C_i$ such as transistors are arranged (the set of components $C_i$ being diagrammatically represented by a box in discontinuous lines in FIG. 1).

The upper part 112 of the connection element 110 is formed from a metallic zone 112a lining the bottom and walls of the first hole 104 and at least one other metallic zone 112b extending on the front face of the substrate 100 or parallel to the front face of the substrate 100 and it may act as a contact continuity zone.

The first hole 104 is also filled at its centre with a zone made of material 111 with a lower coefficient of thermal expansion than the metallic material of said upper part 112 of the connection element 110. This material 111 may be insulating and for example be made of polymer such as Benzocyclobutene (BCB).

The metallic connection element 110 also comprises a lower part 142 made in at least one second hole 134 communicating with the first hole 104 and opening up on the side of the face of the substrate called the "back face", opposite the first face.

The lower part 142 of the connection element 110 is formed of a metallic zone 142a lining the bottom and the walls of the second hole 134 and at least one other metallic zone 142b extending on the back face of the substrate 100 or parallel to the back face of the substrate 100. This other metallic zone 142b may act as a contact continuity zone.

The second hole 134 is also filled at its centre with a material 141 that has a lower coefficient of thermal expansion than the metallic material of said lower part 142 of the connection element 110. This material 141 may be insulating and for example it may be based on a polymer such as Benzocyclobutene (BCB).

The walls of the first hole 104 and the second hole 134 are covered with a thickness $e_1$ and $e_2$ respectively of a dielectric material in order to electrically isolate the connection element 140 from the substrate 100.

The first hole 104 and the second hole 134 may be vertical.

The first hole 104 in which the upper part of the connection element is formed has a critical dimension $D_1$ (measured along a direction parallel to the $[O; \vec{i}; \vec{k}]$ plane in the $[O; \vec{i}; \vec{j}; \vec{k}]$ orthogonal coordinate system in FIG. 1) and a height $H_1$ or depth $H_1$ (measured along a direction parallel to vector $\vec{j}$ $[O; \vec{i}; \vec{j}; \vec{k}]$ in the orthogonal coordinate system in FIG. 1). Throughout this description, "critical dimension" means the smallest dimension of an element, or a pattern, or a zone, other than its thickness or its height.

The second hole 134 has a critical dimension $D_2$ (measured along a direction parallel to the $[O; \vec{i}; \vec{k}]$) plane and a height $H_2$ or a depth $H_2$ (measured along a direction parallel to the vector $\vec{j}$).

The first hole 104 and the second hole 134 are selected such that $H_2 < H_1$ and $D_2 < D_1$, to limit stresses within the interconnection structure.

The first hole 104 may be made such that its height $H_1$ is at least ten times more than the height $H_2$ of the second hole 134. The first hole 104 may be made such that its section is larger than the section of the second hole 134, and in particular such that the critical dimension $D_1$ of the first hole 104 is 4 times greater than the critical dimension $D_2$ of the second hole 134.

Thus, due to the dimension of the holes 104 and 134, substrate zones 100 around the lower part 142 and under the upper part 112 of the metallic connection element 110, may form bars or beams 101 with a large aspect ratio, i.e. length to thickness ratio, to enable a spring or damping effect of stresses within the interconnection structure.

The thickness $e_p$ of the beams 101 depends particularly on the height $H_2$ of the lower part 142 of the connection element and it may be of the order of the difference between $H_2$ and the thickness $e_1$ of the insulating layer separating the connection element 110 from substrate 100 at the bottom of the first hole 104.

The length $l_p$ of the beams 101 under the lower part 142 of the connection element 140 depends on the difference between the critical dimension $D_1$ of the first hole 104 and the critical dimension $D_2$ of the second hole 134. The length $l_p$ may be of the order of the difference $(D_1+e_1)-(D_2+e_2)$ between the accumulated distance $(D_1+e_1)$ of the critical dimension $D_1$ and the thickness $e_1$ of the insulating layer separating the upper part 112 of the connection element 110 from the substrate 100 at the bottom of the first hole 104, and the accumulated distance $(D_2+e_2)$ of the critical dimension $D_2$ and the thickness $e_2$ of the insulation layer separating the lower part 142 of the connection element 110 from the substrate 100 at the walls of the second hole 134.

For example, in the case in which $d_1 \approx e_2$, the ratio $(D_1-D_2)/H_2$ may for example be equal to at least 4 to enable a large reduction in the stresses.

The arrangement of the connection element in the form of zones lining the walls of the first hole 104 and the second hole 134 gives good mechanical strength and also contributes to limiting the stresses in the interconnection structure.

The first hole 104 may also be made so that it comprises a bottom with rounded edges 104a. This can also contribute to reducing stresses in the interconnection structure.

Figure 2A:
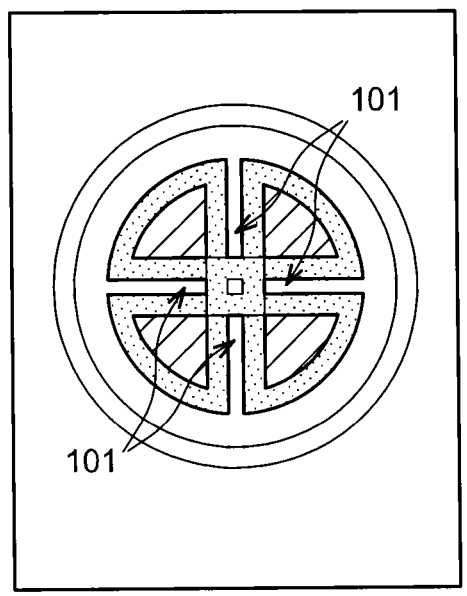
FIGS. 2A-2B show means of releasing applied mechanical stresses within a TSV type interconnection structure used according to the invention.
Figure 2B:
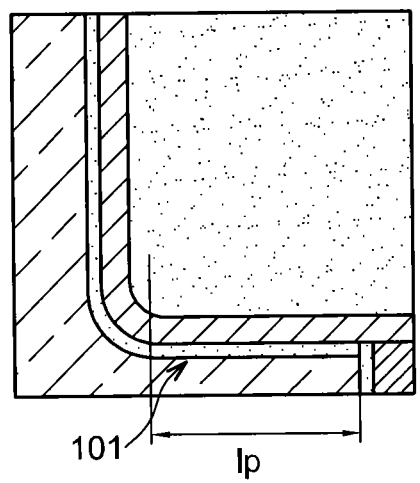

FIGS. 2A-2B show an example layout under the upper part 142 of a metallic connection element 110 of an interconnection structure, in a bottom view (FIG. 2A) and along a longitudinal section A'A (shown in FIG. 2B).

The upper part 112 of the connection element 110 is supported by zones of the substrate 100 forming beams 101 under the rounded edges of the first hole 104, the aspect ratio of these beams 101 being selected to release stresses induced by the metallic material.

Different example embodiments of the lower part 142 of the metallic connection element of a TSV type interconnection structure are shown in FIGS. 3A-3H.

Figure 3A:
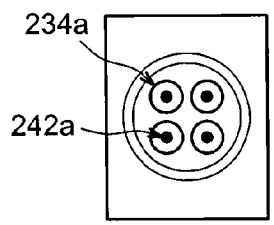
FIGS. 3A-3H show different example embodiments of the lower part of a TSV type interconnection structure according to the invention.
Figure 3B:
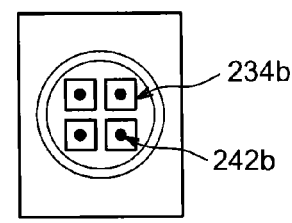
Figure 3C:
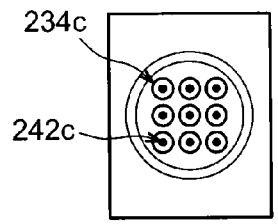

In the example in FIGS. 3A and 3C, the lower part of the connection element comprises several metallic zones 242a, 242c formed in the holes 234a, 234c respectively, in the form of a cylinder of revolution, the walls of which are covered by an insulating material and the centre of which is also filled with insulating material.

Figure 3D:
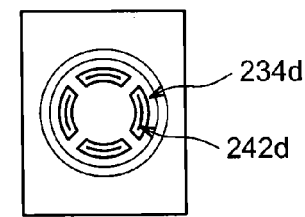
Figure 3E:
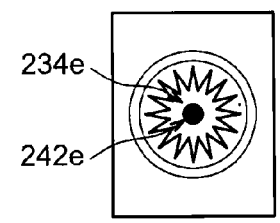
Figure 3F:
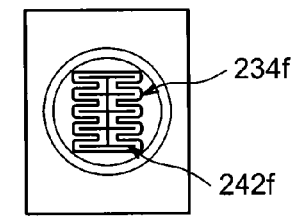
Figure 3G:
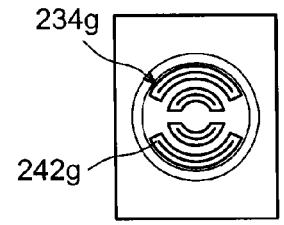
Figure 3H:
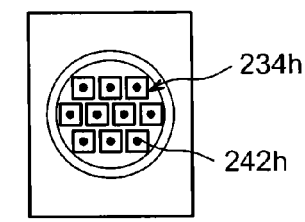

In the examples in FIGS. 3B and 3H, the holes 234b, 234h in which the metallic zones 242a, 242h forming the lower part of the connection element have a rectangular parallelepiped shape.

According to other examples shown in FIGS. 3D and 3G, the lower part of the metallic connection element comprises several discontiguous metal zones 242d, 242g arranged in the vertical holes 234d, 234g passing partially through a substrate and with curved walls, the holes being arranged relative to each other so that their cross-sections are in the shape of a ring, or several concentric rings.

According to another example embodiment shown in FIG. 3E, the lower part of the metallic connection element comprises a metallic zone 242e arranged in a hole 234e, the cross-section of which forms a contour in a saw tooth pattern.

According to another example embodiment shown in FIG. 3F, the lower part of the metallic connection element comprises a metallic zone 242f arranged in a hole 234f with a comb-shaped cross-section.

One example embodiment of a TSV interconnection structure according to the invention will now be described with reference to FIGS. 4A-4P.

In this example, the initial material may be a semiconducting substrate 100, for example based on Si and with a thickness for example of between 100 μm and 300 μm, covered on one of its faces called the "front face" with an insulating layer 101 that may for example be based on $SiO_2$ and with a thickness for example of the order of 500 nm.

One or several electronic components such as transistors may already have been made on the front face of the substrate 100.

The first step is to form a first hole 104 in part of the thickness of the substrate 100. The first hole 104 may be vertical (the vertical direction being a direction parallel to vector $\vec{j}$ in the $[O;\vec{i};\vec{j};\vec{k}]$ orthogonal coordinate system in FIG. 4A) and it may have a depth $H_1$ (measured along a direction parallel to vector $\vec{j}$) for example between 100 μm and 300 μm and a diameter or a critical dimension $D_1$ (the critical dimension or the diameter being measured along a direction parallel to the $[O;\vec{i};\vec{k}]$ plane in the $[O;\vec{i};\vec{j};\vec{k}]$) orthogonal coordinate system for example between 30 μm and 100 μm.

Figure 4A:
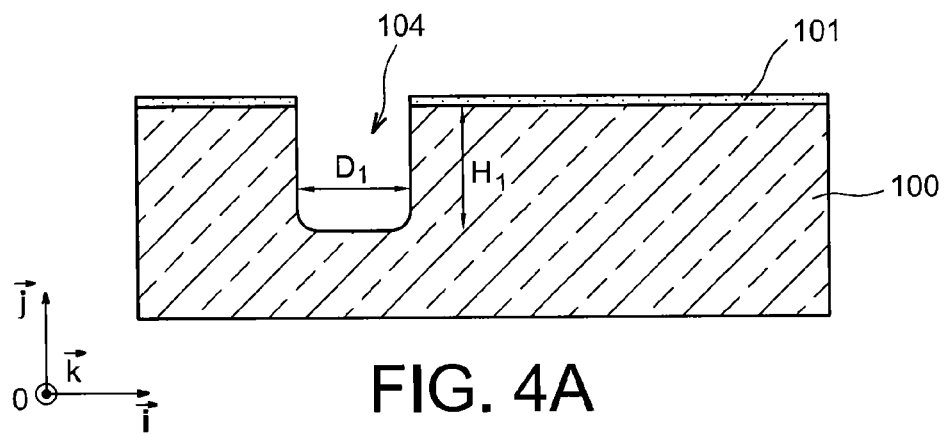
FIGS. 4A-4P show an example of a method according to the invention for making a TSV type interconnection structure.

Throughout this description, the "critical dimension" of an element or a pattern or a zone means the smallest dimension of this element or this pattern or this zone, apart from its thickness or height or its depth (measured along a direction parallel to vector $\vec{j}$ in the $[O;\vec{i};\vec{j};\vec{k}]$ orthogonal coordinate system in FIG. 4A).

A second insulating layer 105 can then be formed on the walls and the bottom of the first hole 104, continuous with the first insulating layer 101.

This may for example be done by thermal oxidation of the semiconducting material of the substrate 100 or by deposition, for example SACVD (Sub-Atmospheric Pressure Chemical Vapour Deposition) or LPCVD (Low Pressure Chemical Vapour Deposition). The second insulating layer 105 may for example be chosen to have a thickness $e_1$ approximately equal to the thickness of the insulating layer 101 covering the front face of the substrate 100 and for example between 10 nm and 10 μm.

Figure 4B:
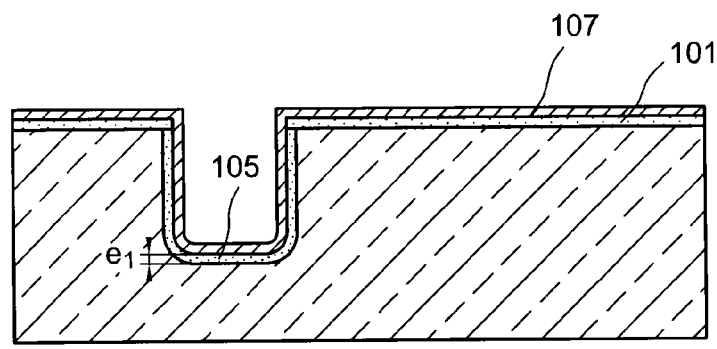

The next step (FIG. 4B), is to deposit a so-called "growth" layer 107 on the front face of the substrate 100 so as to cover the insulating layer 101 and to line the walls and the bottom of the first hole 104. This growth layer 107 may be formed from a bi-layer, for example comprising a sub-layer based on Ti and a sub-layer of Cu deposited for example by PVD (Physical Vapour Deposition). According to another possibility, the bi-layer may for example be formed based on TiN and Cu and may be deposited for example by CVD (Chemical Vapour Deposition). The growth layer 107 is selected to encourage growth of a metallic material for example such as Cu on the walls and at the bottom of the hole 104.

Thus, the next step is to form a layer of metallic material 109 so as to partially fill the first hole 104. This filling is done so as to line the bottom and the walls of the first hole 104, and it may be done so as to cover the zones of the front face of the substrate 100 located close to the opening of the first hole 104. Partial filling of the first hole 104 is done such that a zone located at the centre of the first hole 104 is not filled with metallic material. The metallic material may for example be Cu and it may be formed by an ECD (Electrochemical Deposition) method. The thickness of the layer of metallic material 109 made may for example be of the order of 10 μm. This thus forms an upper part 112 of a vertical connection element 110 or via in the first hole 104.

Figure 4C:
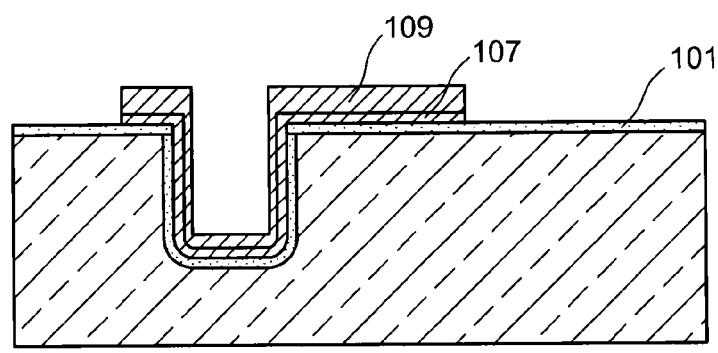

The next step is to remove the growth layer 107 in zones located on the front face of the substrate 100 and around the upper part 112 of the vertical connection element 110. This may be done for example by wet chemical etching using $H_2SO_4$ or HF (FIG. 4C).

Figure 4D:
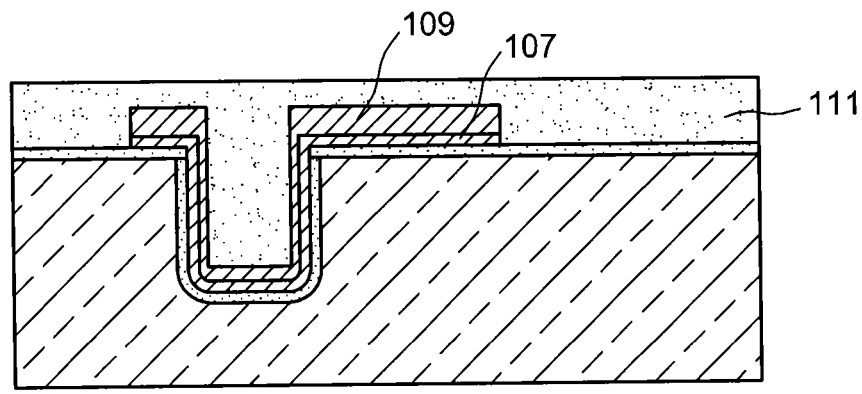

The next step is to form a layer 111 based on a material with a lower coefficient of thermal expansion than the materials 107 and 109, so as to fill the central zone of the hole 104 and cover the front face of the substrate 100. This layer 111 may be insulating. For example, this insulating layer 111 may be based on polymer and may be made so as to cover the metallic layer 109 and fill the hole 104. The polymer material of the insulating layer 111 may for example be Benzocylcobutene (BCB). The insulating thickness 111 may for example be between 10 μm and 30 μm (FIG. 4D).

Figure 4E:
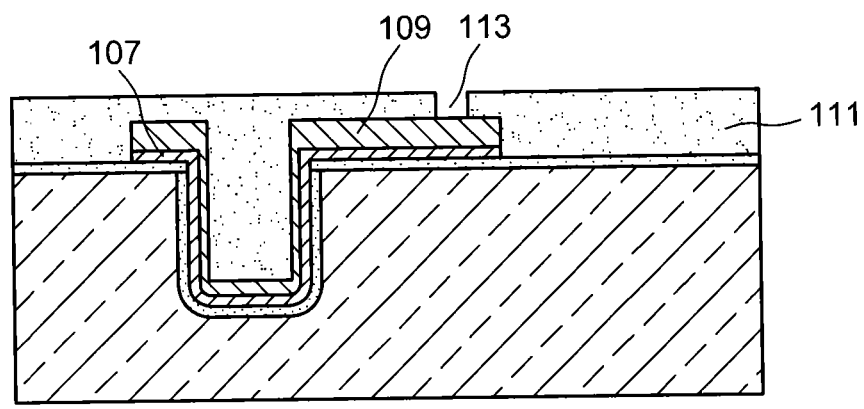

The next step is to make an opening 113 in the insulating layer 111 exposing a zone of the metallic layer 109 supported on the front face of the substrate 100 (FIG. 4E).

Figure 4F:
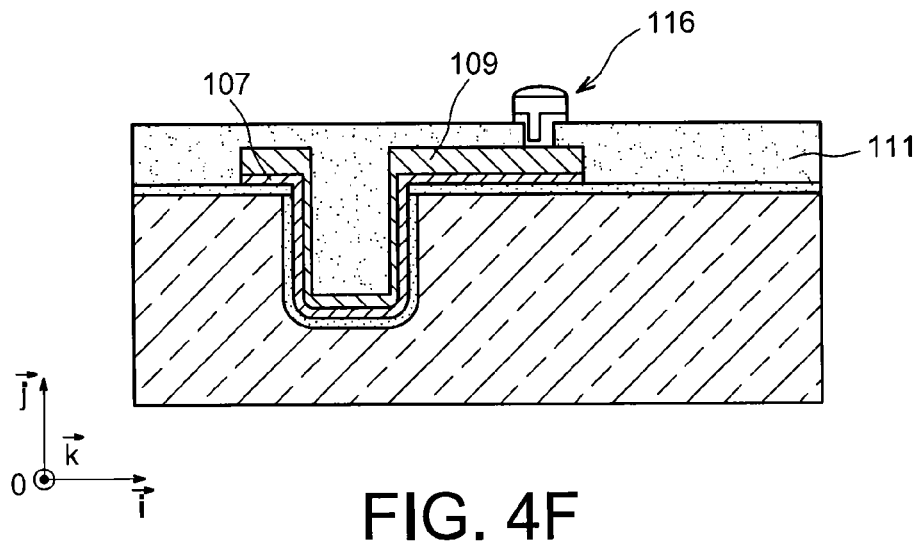

The next step is to form a metallic connection pad 116 in this opening 113, for example based on Cu or formed from a stack of metallic layers covered with a Cu layer. The connection pad 116 may for example have a height (measured along a direction parallel to vector $\vec{j}$ in the $[O;\vec{i};\vec{j};\vec{k}]$ orthogonal coordinate system in FIG. 4F) of between 10 μm and 30 μm.

Figure 4G:
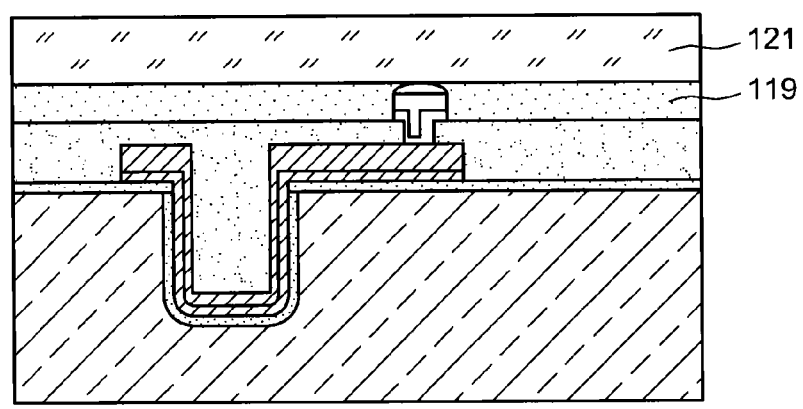

The next step is to form a handle layer 121 on the front face of the substrate 100. This handle layer 121 may for example be based on glass or silicon and assembled to the substrate 100 through a glue layer 119 for example based on a polymer that may be a thermoplastic material with adhesive properties. The thickness of the glue layer 119 may for example be between 100 μm and 1000 μm (FIG. 4G).

The substrate 100 can then be thinned by the removal of a portion of the substrate 100 located on the side of the face called the "back face" which is opposite the front face.

This thus reduces the distance d between the bottom of the first hole 104 and the back face of the substrate 100. The thickness of the substrate 100 that is removed may for example be between 100 μm and 1000 μm.

Figure 4H:
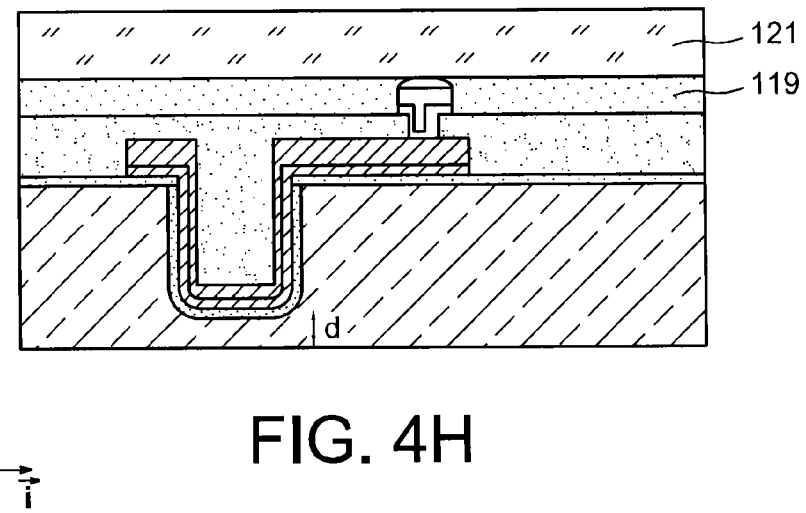

Thinning may be done such that the distance d (measured along a direction parallel to vector $\vec{j}$ of the $[O;\vec{i};\vec{j};\vec{k}]$ orthogonal coordinate system in FIG. 4H) separating the bottom of the first hole 104 and the back face of the substrate 100 is less than 20 μm or less than or equal to 10 μm.

The back face of the substrate 100 may then be covered by an insulating layer 131 that may for example be based on SiO$_2$ and made by deposition or by oxidation.

Figure 4I:
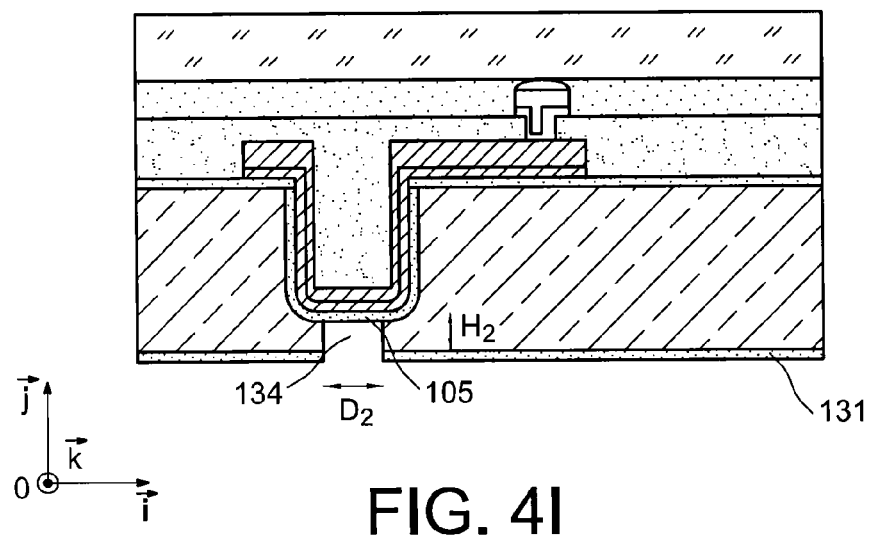

The next step is to form a second hole 134 in part of the thickness of the substrate 100 facing the first hole 104. This second hole 134 may be made so as to open up onto the insulating layer 105 lining the bottom of the first hole 104. The second hole 134 may for example be made by etching using KOH (FIG. 4I).

The height H$_2$ and cross-section of the second hole 134 are smaller than the height and cross-section of the first hole 104.

The second hole 134 may be selected with a depth H$_2$ (measured along a direction parallel to vector $\vec{j}$ in the $[O;\vec{i};\vec{j};\vec{k}]$ orthogonal coordinate system) of less than 20 μm or preferably less than or equal to 10 μm. The second hole 134 is thus made with a lower height H$_2$ than the first hole 104, and with a diameter or critical dimension D$_2$ (the critical dimension or the diameter being measured along a direction parallel to the $[O;\vec{i};\vec{k}]$ plane in the $[O;\vec{i};\vec{j};\vec{k}]$ orthogonal coordinate system in FIG. 4I) for example between 1 μm and 50 μm and smaller than the critical dimension D$_1$ of the first hole 104.

Figure 4J:
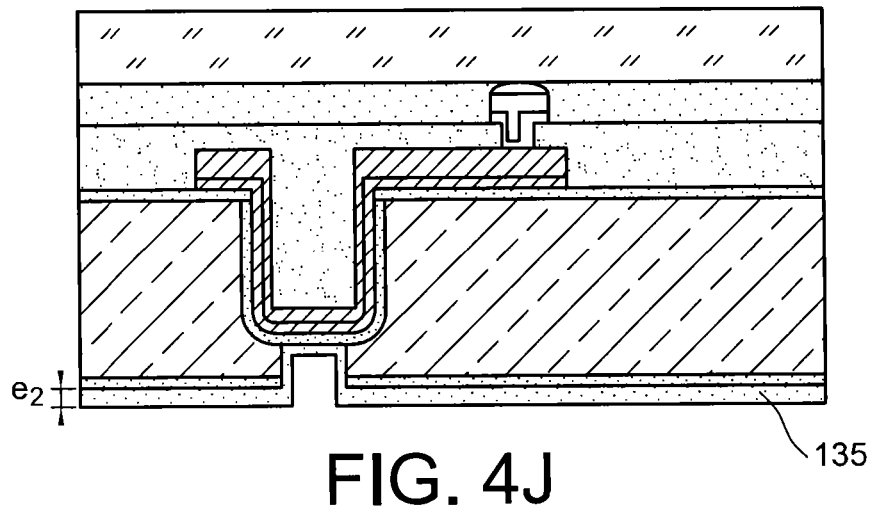

Another insulating layer 135 continuous with the insulating layer 131 can then be formed on the walls and the bottom of the second hole 134. This can be done for example by thermal oxidation of the semiconducting material of the substrate 100, particularly when the insulating layer 135 is based on SiO$_2$. According to another possibility (FIG. 4J), the insulating layer 135 may be based on polymer such as for example BCB. This other insulating layer 135 may have a thickness e$_2$ for example between 10 nm and 10 μm.

Figure 4K:
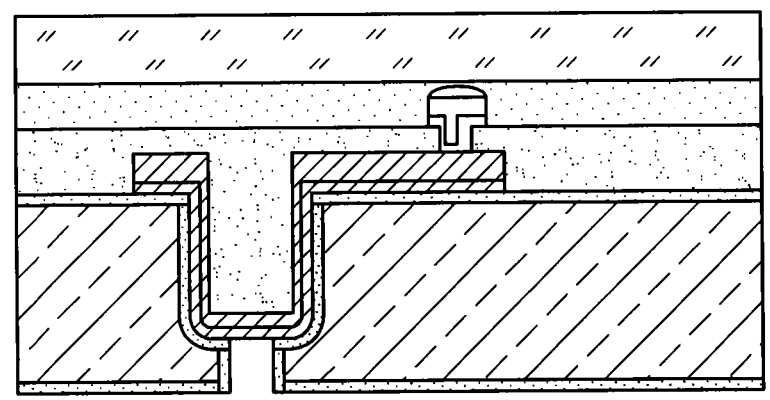

The next step is to remove the insulating layer 135 at the bottom of the second hole 134 and the portion of the insulating layer 105 lining the bottom of the first hole 104. This removal may be done for example using RIE (Reactive Ion Etching) type dry etching, for example based on CF$_3$—O$_2$. This exposes a metallic zone of the upper part 112 of the metallic connection element (FIG. 4K).

Figure 4L:
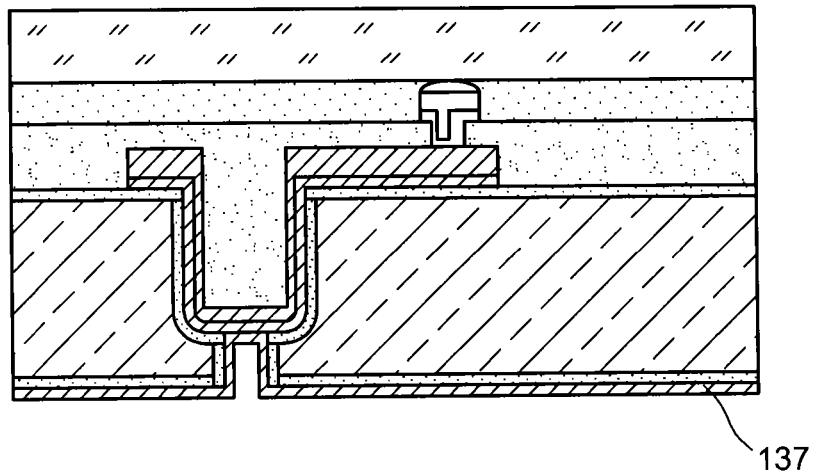

Another metallic "growth" layer 137 can then be formed on the back face of the substrate 100 so as to cover the insulating layer 131 and to line the walls of the second hole 134. This other growth layer 137 may also be made at the bottom of the second hole 134. The growth layer 137 may be formed from a bi-layer, for example based on Ti and Cu or based on TiN and Cu (FIG. 4L).

The next step is to form a layer of metallic material 139 so as to partially fill the second hole 134 and to line the bottom and the walls of this second hole, and possibly to cover zones of the back face of the substrate 100 located close to the opening of the second hole 134.

Figure 4M:
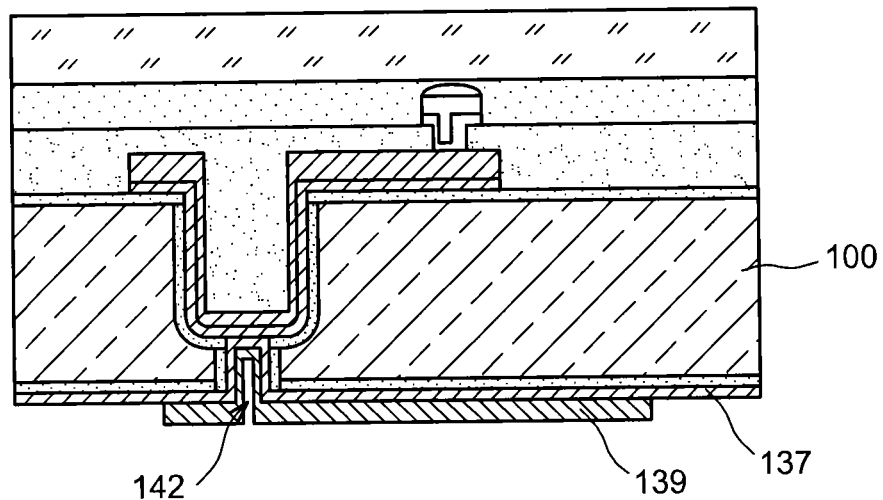

Partial filling of the second hole 134 is thus made such that a zone located at the centre of the second hole 134 is not filled with the metallic material (FIG. 4M). The metallic filling material 139 may for example be Cu. This is how the lower part 142 of the vertical connection element is made.

The central zone of the second hole 134 is then also filled so as to close it off with a material 141 with a smaller coefficient of thermal expansion than the metallic material(s) lining the walls of the second hole 134. The material 141 may be insulating so as to make a passivation layer on the back face of the substrate 100. For example, the insulating material 141 may be a polymer material such as BCB. The thickness of the passivation layer may for example be between 0.5 μm and 20 μm.

Figure 4N:
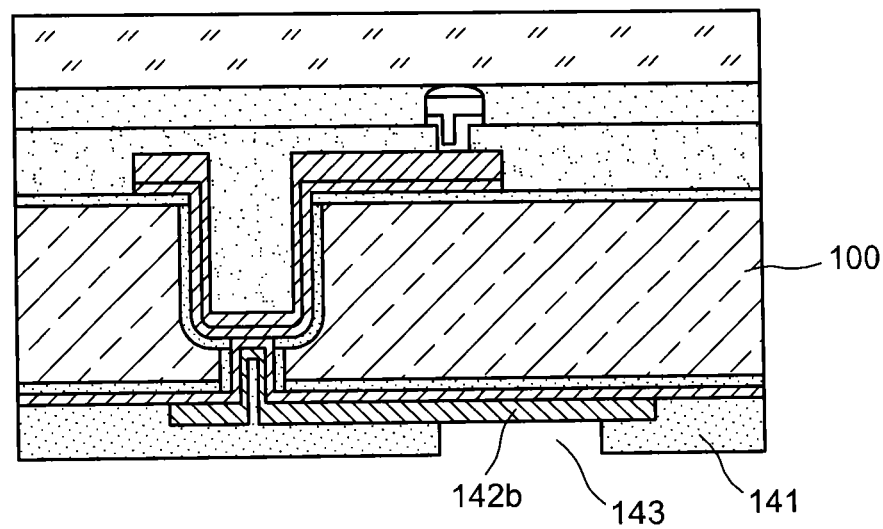

The next step is to make an opening 143 in the passivation layer 141 exposing a zone 142b in the lower part 142 of the vertical connection element supported on the back face of the substrate 100 (FIG. 4N).

Figure 4O:
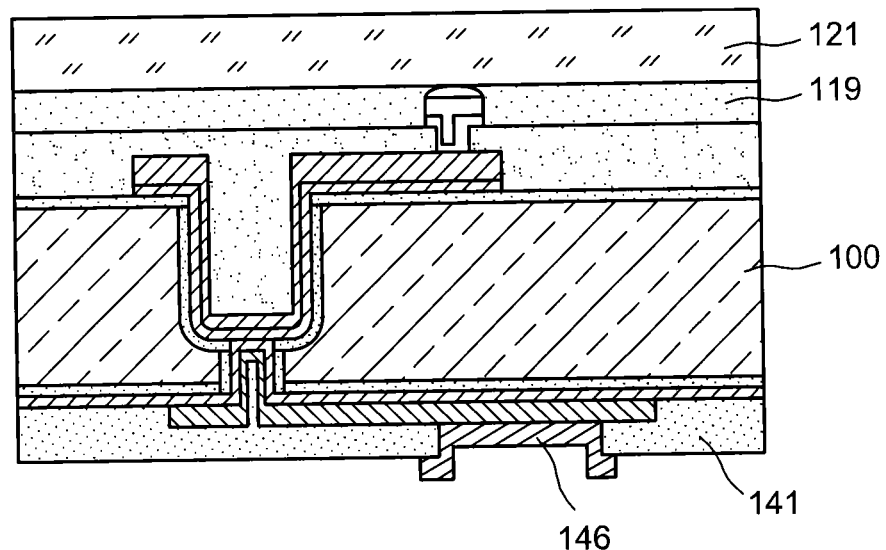

The next step is to form a metallic connection pad 146 in this opening 143, for example based on Cu or formed from a stack of metallic layers covered by a Cu layer (FIG. 4O).

Figure 4P:
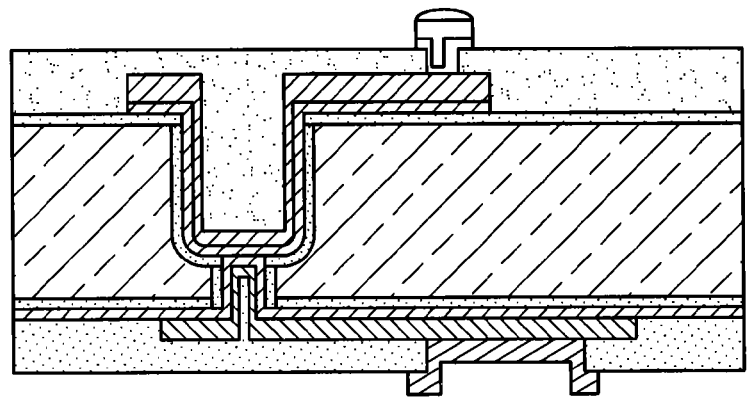

The handle layer 121 is then removed for example through removal by shearing (FIG. 4P).

Figure 5A:
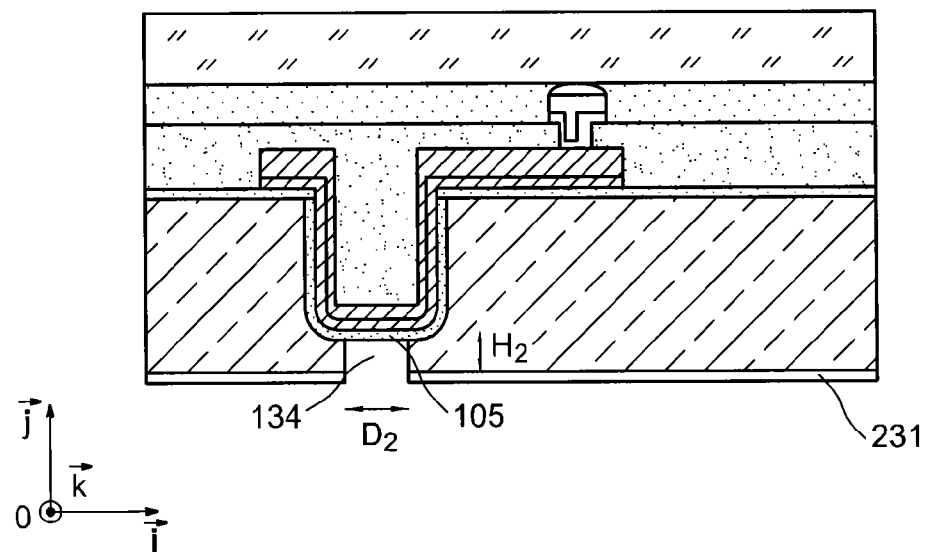
FIGS. 5A-5C show an example of the method according to the invention for making a variant TSV type interconnection structure used according to the invention.
Figure 5B:
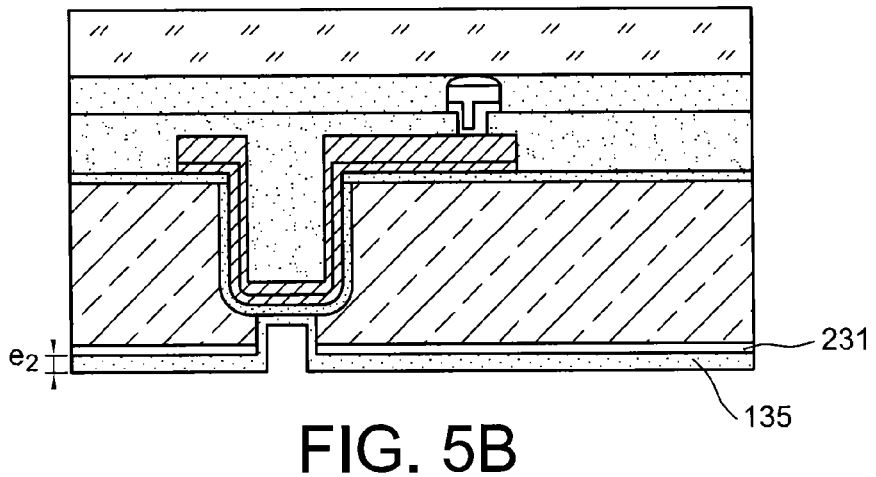
Figure 5C:
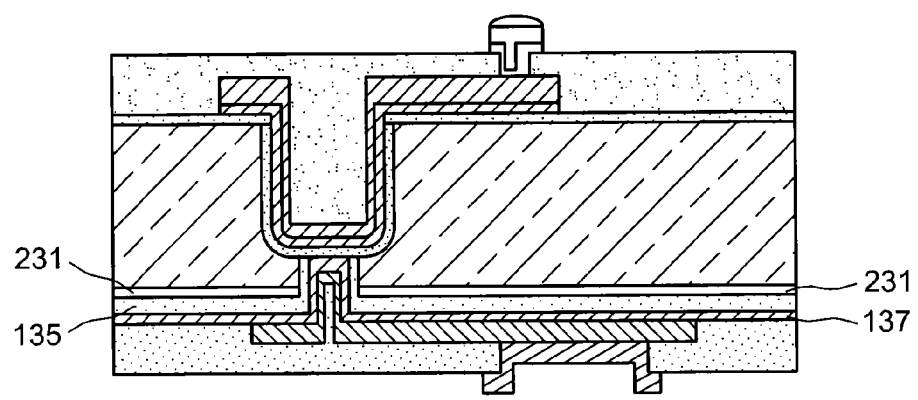

FIGS. 5A-5C show a variant of the method for making an interconnection structure like that described above with reference to FIGS. 4A-4P.

For this variant, after the thinning step described with reference to FIG. 4H, the back face of the substrate 100 is covered by a layer 231 that may be based on a material with a high coefficient of thermal expansion (CTE), for example more than 20 ppm/° C. and a high Young's modulus for example higher than 150 GPa. The layer 231 may in particular be chosen to be based on a material with a higher coefficient of thermal expansion and a higher Young's modulus than the material in the substrate 100 on which this layer 231 is deposited.

For example, the layer 231 may be based on AlN or TiW, and its thickness may for example be between 1 μm and 20 μm, preferably of the order of 2 μm or 3 μm.

The second hole 134 is then formed in a part of the thickness of the substrate 100 facing the first hole 104. This second hole 134 may be made so as to open up on the insulating layer 105 lining the bottom of the first hole 104 (FIG. 5A).

An insulating layer 135 may then be formed on the walls and the bottom of the second hole 134, for example based on polymer for example such as BCB (FIG. 5B).

Steps similar to those described above with reference to FIGS. 4K to 4M are then performed, consisting of removing the insulating layer 135 from the bottom of the second hole 134 and the insulating layer 105 from the bottom of the first hole 104 so as to expose the metallic layer 107 at the bottom of the first hole 104, and then to form the layer of metallic material 139, the insulating material 141, and the connection pad 146.

The invention claimed is:

1. An interconnection structure having a conducting connection comprising:
 an upper part opening up on a first face of a support on which one or several electronic components are made or will be made, the upper part being made in a first hole partially passing through said support and having a critical dimension D$_1$ and a height H$_1$, said upper part being formed from a conducting material covering the walls and the bottom of the first hole, a central zone in the first hole not being filled with said conducting material, wherein the conducting material of the upper part covering the bottom of the first hole covers the entire bottom of the first hole, is continuous, and is planar, and
 a lower part connected to said upper part and opening up on a second face of the support opposite the first face, the lower part being made in one or several second hole(s) communicating with the first hole and partially passing through said support, the second hole(s) having a critical dimension D$_2$<D$_1$ and height H$_2$<H$_1$, said lower part being formed from a conducting material covering the walls and the bottom of the second hole(s), a central zone of said second hole(s) not being filled by said conducting material, a layer of a given material disposed directly on said second face of the support, said layer of the given material formed completely outside said second holes(s), and said given material having a Young's modulus greater than 150 Gpa and a coefficient of thermal expansion greater than 20 ppm/° C., wherein an insulating material is formed in at least a center of the central zone of said second hole(s) at least in a region between the first face and the second face of the support.

2. The interconnection structure according to claim 1, the central zone of said first hole being filled with an insulating material at least in the region between the first face and the second face of the support.

3. The interconnection structure according to claim 2, a coefficient of thermal expansion of the insulating material filling the central zone of said first hole and/or second hole(s) is lower than that of the conducting material covering the walls of the first and the second hole.

4. The interconnection structure according to claim 1, the critical dimension $D_1$, the critical dimension D2 and the height $H_2$, being selected such that (D1−D2)/H2>4.

5. The interconnection structure according to claim 1, the height $H_2$ of said second hole(s) is such that $H_2<H_1/10$.

6. The interconnection structure according to claim 1, the critical dimension $D_2$ of said second hole(s) is such that $D_2 \leq 0.5*D_1$.

7. The interconnection structure according to claim 1, wherein said upper part of said conducting connection comprises a conducting zone extending on or parallel to the first face of the support, said lower part of said conducting connection comprising a conducting zone extending on or parallel to the second face of the support.

8. The interconnection structure according to claim 1, wherein the first hole has round edges.

9. The interconnection structure according to claim 1, wherein the walls of the first hole and the walls of the second hole(s) are vertical and perpendicular to the critical dimensions $D_1$ and $D_2$.

10. An interconnection structure having a conducting connection comprising:

an upper part opening up on a first face of a support on which one or several electronic components are made or will be made, the upper part being made in a first hole partially passing through said support and having a critical dimension $D_1$ and a height $H_1$, said upper part being formed from a conducting material covering the walls and the bottom of the first hole, a central zone in the first hole not being filled with said conducting material, and a lower part connected to said upper part and opening up on a second face of the support opposite the first face, the lower part being made in one or several second hole(s) communicating with the first hole and partially passing through said support, the second hole(s) having a critical dimension $D_2<D_1$ and height $H_2<H_1$, said lower part being formed from a conducting material covering the walls and the bottom of the second hole(s) and extending parallel to the second face of the support outside said second hole(s), a central zone of said second hole(s) not being filled by said conducting material, wherein the interconnection structure further comprises a layer of a given material disposed between said second face of the support and the conducting material extending parallel to the second face of the support outside said second hole(s), said layer of the given material formed completely outside said second holes(s), said layer of the given material extending parallel to the second face of the support, and said given material having a Young's modulus greater than 150 Gpa and a coefficient of thermal expansion greater than 20 ppm/° C., and an insulating material is formed in at least a center of the central zone of said second hole(s) at least in a region between the first face and the second face of the support.

11. The interconnection structure according to claim 1, wherein the given material is one of aluminium nitride and titanium tungsten.

12. The interconnection structure according to claim 10, wherein the insulating material is a polymeric material different from said given material.

13. The interconnection structure according to claim 12, wherein the insulating material is Benzocyclobutene.

* * * * *